(12) United States Patent
Katampe

(10) Patent No.: US 6,387,585 B1
(45) Date of Patent: May 14, 2002

(54) SELF-CONTAINED IMAGING ASSEMBLY HAVING IMPROVED PEEL STRENGTH

(75) Inventor: Ibrahim Katampe, Kettering, OH (US)

(73) Assignee: Cycolor, Inc., Miamisburg, OH (US)

( * ) Notice: Subject to any disclaimer, the term of this patent is extended or adjusted under 35 U.S.C. 154(b) by 0 days.

(21) Appl. No.: 09/545,405

(22) Filed: Apr. 7, 2000

(51) Int. Cl.⁷ .............................. G03C 3/00; G03C 7/46; G03F 7/105; G03F 7/11; G03F 7/085
(52) U.S. Cl. ........................ 430/138; 430/496; 430/954
(58) Field of Search ................................ 430/138, 496, 430/954

(56) References Cited

U.S. PATENT DOCUMENTS

| | | | |
|---|---|---|---|
| 3,672,935 A | 6/1972 | Miller et al. | 117/36.8 |
| 4,336,326 A | 6/1982 | Evans | 430/523 |
| 4,440,846 A | 4/1984 | Sanders et al. | 430/138 |
| 4,551,407 A | 11/1985 | Sanders | 430/138 |
| 4,713,312 A | 12/1987 | Adair et al. | 430/138 |
| 4,766,050 A | 8/1988 | Jerry | 430/138 |
| 4,842,980 A | 6/1989 | Gottschalk et al. | 430/138 |
| 4,874,450 A | 10/1989 | Gottschalk | 156/275.5 |
| 4,921,832 A | 5/1990 | Adair et al. | 503/201 |
| 5,030,539 A | 7/1991 | Kintz et al. | 430/138 |
| 5,283,152 A | 2/1994 | Feldman et al. | 430/138 |
| 5,714,452 A | 2/1998 | Brouwer | 510/394 |
| 5,783,353 A | 7/1998 | Camillus et al. | 430/138 |
| 5,916,727 A | 6/1999 | Camillus et al. | 430/138 |
| 6,030,740 A | 2/2000 | Polykarpov | 430/138 |
| 6,037,093 A * | 3/2000 | Hattori | 430/138 |
| 6,127,084 A * | 10/2000 | Katampe et al. | 430/138 |

FOREIGN PATENT DOCUMENTS

WO  WO 95/34845  12/1995

* cited by examiner

Primary Examiner—Richard L. Schilling
(74) Attorney, Agent, or Firm—Thompson Hine LLP

(57) ABSTRACT

A self-contained photohardenable imaging assembly comprising a first transparent polymeric film support, an imaging layer comprising a plurality of photosensitive microcapsules, a developer material and an adhesion promoter, and a second support which may be transparent or opaque is disclosed. Upon image-wise exposure and image development, an image forms in the imaging layer sealed between the supports to form an integral unit having improved peel strength.

18 Claims, No Drawings

SELF-CONTAINED IMAGING ASSEMBLY HAVING IMPROVED PEEL STRENGTH

BACKGROUND OF THE INVENTION

The present invention relates to a self-contained imaging assembly and, more particularly, to a self-contained imaging assembly exhibiting improved peel resistance. This invention is an improvement in the invention described in commonly assigned U.S. Pat. Nos. 4,440,846 and 5,783,353, which disclose self-contained imaging assemblies in which a layer of microcapsules containing a chromogenic material and a photohardenable or photosoftenable composition, and a developer, which may be in the same or a separate layer from the microcapsules, is image-wise exposed, the microcapsules ruptured, and an image is produced by the differential reaction of a chromogenic material and the developer. U.S. Pat. No. 5,783,353 more specifically discloses a self-contained media in which the photosensitive microcapsules and the developer are sealed between two plastic films such that the user never comes into contact with the chemicals which form the image unless the media is deliberately destroyed. It would be desirable to have a composite media similar to that disclosed in U.S. Pat. No. 5,783,353 which provides an imaging assembly having increased peel strength without adversely affecting the imaging characteristics.

SUMMARY OF THE INVENTION

In the self-contained imaging system of the present invention, the imaging layer comprises a developer, photohardenable microcapsules and an adhesion promoter. The imaging layer is sealed between two support members to form an integral unit having improved peel strength. This sealed format is advantageous because it prevents the developer material and the contents of the microcapsules from contacting persons during handling and, depending on the nature of the supports, it may also prevent oxygen from permeating into the photohardenable material which may improve film speed and the stability of the image. The term "sealed" as used herein refers to a seal which is designed as a nontemporary seal which results in destruction of the imaging assembly if the seal is broken. Adhesion promoters used in accordance with the present invention increase cohesion and adhesion within and between the layers of the composite imaging sheet to produce an imaging system having overall improved peel strength. The peel strength provides an indication of the integrity of the composite, self-contained imaging system. Increasing the peel strength of the imaging system insures that the benefits associated with having a sealed system are not compromised. The imaging system of the present invention exhibits superior temperature and humidity performance as compared to prior art systems.

In the imaging assembly of the invention, the previously mentioned first support is transparent and the second support may be transparent or opaque. In the latter case, an image is provided against a white background as viewed through the transparent support and in the former case a transparency is provided in which the image is viewed as a transparency preferably using an overhead or slide projector. Sometimes herein the first support may be referred to as the "front" support and the second support may be referred to as the "back" support.

In order to insure that the imaging system is effectively sealed between the supports, a subbing layer is provided between the supports, a subbing layer is provided between one of the supports and the imaging layer and an adhesive is provided between the other support and the imaging layer. For optical clarity, the subbing layer will typically be located between the first support and the imaging layer. However, which support receives the subbing layer and which support receives the adhesive is a function of which support is coated with the wet imaging layer composition and which is assembled with the coated and dried imaging layer. The support which is coated with the imaging layer composition (which is typically the front support) will be provided with the subbing layer and the support which is assembled with the dried imaging layer will receive the adhesive.

The use of an imaging layer containing both the microcapsules and the developer is desirable because the image is formed in direct contact with the front transparent support through which the image is viewed. It has been found that this provides better image quality than, for example, providing a developer layer which overlies a separate layer of microcapsules, because the assembly can be exposed and viewed from the same side, the image can be viewed against a white background (when the back support is opaque) and, the image lies directly under the support through which it is viewed where it is most intense.

Applicants have discovered that the cohesive strength of the imaging layer containing both the microcapsules and the developer in prior art systems is less than the adhesive bonding strength between any two adjacent layers of the imaging system. Accordingly, the imaging layer is the weak link in the composite structure and tends to separate first when the imaging system is subjected to a peeling force. It would be desirable to have the imaging layer remain intact upon application of a peeling force to the imaging system. In this way the components of the microcapsules and the developer remain sequestered in the imaging layer where they are less likely to come in contact with persons handling the media. In accordance with the present invention, an adhesion promoter is added to the imaging layer to increase cohesion within the imaging layer as well as increase adhesion of the imaging layer to the adjacent layers of the imaging system. The overall increase in peel strength of the imaging system insures that the integrity of the system is maintained. The increased integrity of the sealed imaging system of the present invention also provides benefits in the form of superior temperature and humidity performance.

To record images the imaging material can be scanned with an LED print head and developed by application of pressure to the unit. An image appears on the face of the unit. The media can be printed using a printer which incorporates an LED print head in combination with one LED/developer head of the type described in U.S. Pat. No. 5,550,627. Of course, the media can be exposed and developed using any of the exposure and developing equipment that is taught in the art as it relates to imaging materials employing photosensitive microcapsules of this type, e.g., laser scan, LCD, laser-addressed LCD, reflection imaging, etc. Other development devices such as pressure roller development could be used.

DETAILED DESCRIPTION OF THE INVENTION

In accordance with one embodiment of the present invention, a self-contained imaging system 1 comprises in order: a first transparent support 10, a subbing layer 11, an imaging composition 12 comprising photohardenable microcapsules 14 and a developer material 16, a layer of adhesive 18, and a second support 20 which may or may not contain an opacifying agent 26.

Images are formed in the present invention in the same manner as described in U.S. Pat. No. 4,440,846. By imagewise exposing this unit to actinic radiation, the microcapsules are differentially hardened in the exposed areas as taught in U.S. Pat. No. 4,440,846. The exposed unit is subjected to pressure to rupture the microcapsules.

The self-contained imaging system after exposure and rupture of the microcapsules, ruptured microcapsules 22 release a color forming agent, whereupon the developer material 16 reacts with the color forming agent to form an image 24. The image formed is viewed through the transparent support 10 against the support 20 which can contain a white pigment. Typically, the microcapsules will consist of three sets of microcapsules sensitive respectively to red, green and blue light and containing cyan, magenta and yellow color formers, respectively, as taught in U.S. Pat. No. 4,772,541. Also useful in the present invention is a silver-based photohardenable microencapsulated system such as that described in U.S. Pat. Nos. 4,912,011; 5,091,280 and 5,118,590 and other patents assigned to Fuji Photo Film Co. Preferably a direct digital transmission imaging technique is employed using a modulated LED print head as mentioned above.

Imaging layer 12 typically contains about 20 to 80% (dry weight) of the developer, about 80 to 20% (dry weight) microcapsules, about 0 to 20% binder and about 0.01 to 10%, preferably 0.5 to 5% of an adhesion promoter. The layer is typically applied in a dry coat weight of about 8 to 20 g/m$^2$. Examples of such a coating formulations are illustrated in the Examples below. Binder materials which may be utilized include polyvinyl alcohol, polyacrylamide, and acrylic latices.

In the self-contained photohardenable imaging assembly the first transparent support 10 through which the image is viewed can be formed from any transparent polymeric film. A film will be selected which provides good photographic quality when viewing the image. Preferably, a film will be used which is resistant to yellowing. The first support 10 is typically a transparent polyethylene terephthalate (PET) support.

The second support 20 is preferably an opaque support such as polyethylene terephthalate (PET) containing an opacifying agent, paper or paper lined with film (polyethylene, polypropylene, polyester, etc.). Most preferably the opaque support is a polyethylene terephthalate support containing about 10% titanium dioxide which provides a bright white opaque support. This support is commercially available from ICI, Ltd. under the product designation Melinex. Typically, each of the front and back PET supports has a thickness of about 2 to 4 mils.

Generally, the opaque support will be available commercially. Some other products which are useful include paper cardboard, polyethylene, polyethylene-coated paper, etc. Opaque films are composites or admixtures of the polymer and the pigment in a single layer, films or coated papers. Alternatively, the opacifying agent can be provided in a separate layer underlying or overlying a polymer film such as PET. The opacifying agent employed in these materials is an inert, light-reflecting material which exhibits a white opaque background. Materials useful as the opacifying agent include inert, light-scattering white pigments such as titanium dioxide, magnesium carbonate or barium sulfate. In a preferred embodiment the opacifying agent is titanium dioxide.

In a preferred embodiment, the opaque second support is sufficiently opaque so that when a self-contained imaging sheet is exposed to radiation through the transparent support, the opaque support is effective to prevent the radiation from penetrating to other imaging sheets which may be stacked behind the imaging sheet during the exposure step. However, if the units are not exposed in a stacked format, the opacity of the support is not critical so long as the support provides the desired background. When both supports are transparent, if they are exposed in a stacked format, each self-contained imaging assembly must be separated from the other by an opaque member such as an opaque sheet or backing which is easily separated from the imaging sheet.

In an alternate embodiment, the imaging layer of the present invention is employed in the construction of a two-sided imaging material in accordance with commonly assigned U.S. Pat. No. 6,037,094. The two-sided imaging material comprises a pair of transparent supports, an opaque support and an imaging layer disposed between each transparent support and the opaque support. The benefits provided by the imaging layer of the present invention are particularly useful in a two-sided imaging material. Adhesion and cohesion characteristics of the composite coating are believed to be more important in a two-sided imaging material because of the additional layers involved in the construction of the imaging assembly.

Adhesion promoters useful in the present invention are materials which improve the cohesive strength of the imaging layer and the adhesion of the imaging layer to other layers in the imaging system without adversely affecting photographic characteristics. Classes of compounds which can be used as adhesion promoters in accordance with the present invention include bis-benzoxazoles, phenylcoumarins, bis-(styryl)biphenyls and triazinyl derivatives of diaminostilbenedisulphonic acids.

The bis-benzoxazole type of adhesion promoters have the general formula (I):

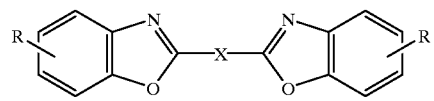

The phenylcoumarins have the general formula (II):

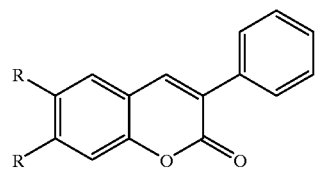

These phenylcoumarins include triazine-phenylcoumarins, benzotriazole-phenylcoumarins and naphtotriazole-phenylcoumarins.

The bis-(styryl)biphenyl type of adhesion promoters have the general formula (III):

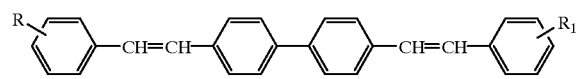

The triazinyl derivatives of diaminostilbenedisulphonic acids have the general formula (IV):

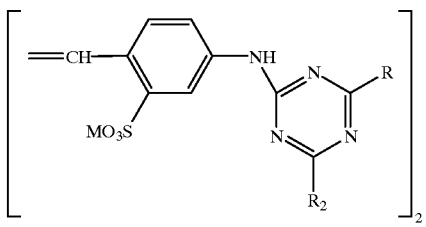

Wherein each R independently represents alkyl, alkoxy, phenyls, carboxylic, sulphonic, phosphoric groups, etc. These compounds can be modified appropriately with most organic functional groups for other desired properties.

These compounds are also useful as UV absorbers and have typically been incorporated into the developer layer to prevent yellowing. Surprisingly, applicants have discovered that these compounds improve cohesion and adhesion characteristics of a single, self-contained imaging layer contained in a sealed imaging system. The effectiveness of these adhesion promoters can be enhanced by the synergistic combination of the different classes. Representative examples of commercially available compounds useful as adhesion promoters in the present invention include: Blankophor (BAYER), Fluolite (ICI), Hostalux (HOECHST), Leuckopur, Tinopal, Uvitex (CIBA), and whitefluor (SUMITOMO CHEM., Jpn.).

Various polymers may be applied as the subbing layer 11 between the first transparent support 10 and the imaging layer 12. The subbing layer may be applied in a coat weight of about 0.4 to 4 g/m$^2$ (dry weight). Useful polymers include polyethylene oxide and, more particularly, AQUAZOL, and hydroxy containing polymers which can bond to the microcapsules such as partially hydrolyzed polyesters and sulfonated polyesters of aromatic acids and aliphatic or cycloaliphatic alcohols and salts thereof such as the AQ polymers available from Eastman Chemical, e.g., AQ38 and AQ55.

Adhesive materials useful in the adhesive layer 18 in the present invention must generally provide high initial adhesion and adhesion to plastic substrates like polyester. One adhesive useful in the present invention is an aqueous-based adhesive such as Aerosett 2177 or Aerosett 2550 both of which are commercially available from Ashland Chemical Co.; PD 0681, AP 6903, and W 3320 available from H.B. Fuller, or a solvent-based adhesive such as PS 508 sold by Ashland Chemical Co. or an acrylic solvent based pressure sensitive adhesive such as 300 adhesive from 3M Corp. The adhesives may be used separately or in combination. Preferably, the adhesive is transparent or translucent and most preferably it is a transparent aqueous-based adhesive which remains clear even after subjecting the assembly to radiation and pressure necessary to image-wise expose and rupture the microcapsules. The amount of the adhesive will vary depending upon the nature of the adhesive and the support. The adhesive is generally applied in an amount of about 0.5 to 20 g/m$^2$.

The peripheral edges of the self-contained assembly can be bonded using any of the conventional means used to seal polymeric materials such as polyethylene terephthalate. For example, films can be sealed using an adhesive or they may be heat sealed together or they can be sealed by any other technique. Preferably, the PET is sealed using a heat sealing method such as a heat knife. While the seal is described as being at the periphery, it will be appreciated that the seal can be inset from the periphery, e.g., by the distance of a border, provided that the seal is interposed between the imaging chemicals and the users.

In accordance with one embodiment of the invention, a full color imaging system is provided in which the microcapsules are in three sets respectively containing cyan, magenta and yellow color formers respectively sensitive to red, green, and blue light respectively. However, digital imaging systems do not require the use of visible light and as such, sensitivity can be extended into the UV and IR. For optimum color balance, the visible-sensitive microcapsules are sensitive ($\lambda$max) at about 450 nm, 540 nm, and 650 mn, respectively. Such a system is useful with visible light sources in direct transmission or reflection imaging. Such a material is useful in making contact prints, projected prints of color photographic slides, or in digital printing. They are also useful in electronic imaging using lasers or pencil light sources of appropriate wavelengths.

The photohardenable composition in at least one and possibly all three sets of microcapsules can be sensitized by a cationic dye-borate complex as described in U.S. Pat. No. 4,772,541. Because the cationic dye-borate anion complexes absorb at wavelengths greater than 400 nm, they are colored and the unexposed dye complex present in the microcapsules in the non-image areas can cause undesired coloration in the background area of the final picture. Typically, the mixture of microcapsules is greenish and can give the background areas a greenish tint. Means for preventing or reducing undesired coloration in the background as well as the developed image include reducing the amount of photoinitiator used and adjusting the relative amounts of cyan, magenta and yellow microcapsules as shown in the example which follows. In this regard it is desirable to include a disulfide compound in the photosensitive composition to reduce the amount of dye-borate that may be required as described in detail in U.S. Pat. No. 5,783,353.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which can be differentially ruptured based upon changes in the internal phase viscosity. Because the dye-borate tends to be acid sensitive, encapsulation procedures conducted at higher pH (e.g., greater than about 6) are preferred.

Melamine-formaldehyde capsules are particularly useful. It is desirable in the present invention to provide a pre-wall in the preparation of the microcapsules. See U.S. Pat. No. 4,962,010 for a particularly preferred encapsulation using pectin and sulfonated polystyrene as system modifiers. The formation of pre-walls is known, however, the use of larger amounts of the polyisocyanate precursor is desired. A capsule size should be selected which minimizes light attenuation. The mean diameter of the capsules used in this invention typically ranges from approximately 1 to 25 microns. As a general rule, image resolution improves as the capsule size decreases. Technically, however, the capsules can range in size from one or more microns up to the point where they become visible to the human eye.

The developer materials and coating compositions containing the same conventionally employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The preferred developer material is one which will permit room temperature development such as zinc salicylate and particularly a mixture of zinc salicylate with a phenol formaldehyde resin. Especially preferred for use is a mixture of zinc salicylate or a zinc salicylate derivative and phenol-formaldehyde resin and, more particularly, a mixture of 25% HRJ 11177, a phenolic resin from Schenectady Chemical Company and 75% zinc salicylate. The particle size of the developer material is important to obtain a high quality image. The developer particles should be in the range of about 0.2 to 3 microns and, preferably in the range of about 0.5 to 1.5 microns.

A preferred developer material is one which has excellent compatibility with the microcapsule slurry solution. Many materials, including zinc salicylate and some phenolic resin preparations, have marginal or poor compatibility with the MF microcapsule preparation and result in agglomeration which is belived to be due to an incompatibility in the emulsifiers used in preparing the microcapsules and in the developer. The problem manifests itself in increasing solution viscosities or in instability of the microcapsules wall (or both). The microcapsules may become completely disrupted with a complete breakdown or disintegration of the wall. The problem is believed to be caused by the presence of water soluble acid salts in the developer solution. By modifying the acidic salts to make them water insoluble the developer material becomes compatible with the MF microcapsules. Examples of preferred developers which have good stability with MF microcapsules include HRJ-4250 and HRJ-4542 available from Schenectady International.

A suitable binder such as polyethylene oxide, polyvinyl alcohol (PVA), polyacrylamide, acrylic latices, neoprene emulsions, polystyrene emulsions and nitrile emulsions, etc. may be mixed with the developer and the microcapsules, typically in an amount of about 1 to 8% by weight, to prepare a coating composition.

The use of appropriate dispersing agents can enhance the adhesion performance of the adhesion promoters of the present invention. This synergistic effect is particularly evident when the dispersing agents are used in conjunction with phenylcoumarin adhesion promoters. Materials that can be used as dispersants in the present invention include partially and fully hydrolyzed polyvinyl alcohol, polyacrylic acid and sodium salts thereof, polyacrylates, and metal salts of condensed arylsulphonic acids. Representative examples of commercially available dispersants useful in the present invention include Rhoplex, Acumer, and Tamol available from Rohm & Haas, Acronal available from BASF and Joncryl available from Johnson Wax.

The dispersant concentration in the imaging system of the present invention can be varied over a wide range, with the upper limit being determined only by economical and practical considerations based on what properties are desired in the final product. It is preferred that the upper limit be about 10%, more preferably 8%, and most preferably about 5%, by weight of the developer resin. The preferred lower limit is about 0.5%. A more preferred lower limit is about 1.0%, with about 1.5% by weight, based on the total weight of the developer resin, being the most preferred lower limit. The dispersant of the invention is an optional additive and can be used either alone or in combination with other dispersants.

Fillers may be incorporated into the imaging layer of the present invention to improve further the cohesive strength of the coating layer and hence the overall binding capability of the layer within the PET substrates is increased tremendously. Such additives include oxides, carbonates and sulfates of metals such as calcium, aluminum, barium, silicon, magnesium, sodium and mixtures of said oxides, carbonates and sulfates, such as tricalcium aluminate hexahydrate, sodium aluminosilicate, aluminum silicate, calcium silicate, barium sulfates (barytes), clays, talc, micas, and mixtures thereof.

Commercially available fillers useful in the present invention include Diafil 590 (CR Minerals), Ultrex 95 (Engelhard), Opti-white (Burgess Inc.), $CaCO_3$ (OMYA, Inc.), hydrophobic and hydrophilic amorphous silica (Wacker), Zeolex, and Hysafe 310 (Huber Corp.).

Microcapsules useful in practicing the present invention are preferably prepared and blended to form a photohardenable layer as illustrated below. In accordance with the invention, the amount of photoinitiator in the microcapsules has been reduced and the ratio of cyan to magenta and yellow capsules has been adjusted to provide a layer with minimal tint so as not to detract from the whiteness of the background.

The invention is illustrated in more detail by the following non-limiting examples.

Model Laboratory Capsule Preparation

1. Into a 200 ml stainless steel beaker, 110 g water and 4.6 g dry sodium salt of polyvinylbenzenesulfonic acid (VERSA) are weighed.

2. The beaker is clamped in place on a hot plate under an overhead mixer. A six-bladed, 45° pitch, turbine impeller is used on the mixer.

3. After thoroughly mixing, 4.0 g pectin (polygalacturonic acid methyl ester) is slowly sifted into the beaker. This mixture is stirred for 2 hours at room temperature (800–1200 rpm).

4. The pH is adjusted to 6.0 with 2% sodium hydroxide.

5. The mixer is turned up to 3000 rpm and the internal phase is added over a period of 10–15 seconds. Emulsification is continued for 10 minutes. Magenta and yellow precursor phases are emulsified at 25°–30° C., Cyan phase is emulsified at 45°–50° C. (oil), 25°–20–30° C. (water).

6. At the start of emulsification, the hot plate is turned up so heating continues during emulsification.

7. After 20 minutes, the mixing speed is reduced to 2000 rpm, and a solution of melamine-formaldehyde prepolymer is slowly added. This prepolymer is prepared by adding 6.5 g formaldehyde solution (37%) to a dispersion of 3.9 g melamine in 44 g water. After stirring at room temperature for 1 hour the pH is adjusted to 8.5 with 5% sodium carbonate and then heated to 62° C. until the solution becomes clear (30 minutes).

8. The pH is adjusted to 6.0, using 5% phosphoric acid. The beaker is then covered with foil and placed in a water bath to bring the temperature of the preparation to 75° C. When 75° C. is reached, the hot plate is adjusted to maintain this temperature for a two hour cure time during which the capsule walls are formed.

9. After curing, mixing speed is reduced to 1800 rpm, formaldehyde scavenger solution (7.7 g urea and 7.0 g water) is added and the solution cured another 40 minutes.

10. After 40 minutes hold time, turn down the mixer rpm to 1100 and adjust the pH to 9.5 using a 20% NaOH solution and then allow to stir at 500 rpm overnight at room temperature.

Three batches of microcapsules are prepared as above for use in a full color imaging sheet using the three internal phase compositions set forth below.

| Yellow Capsule Internal Phase (420 nm) | |
|---|---|
| TMPTA | 163.6 g |
| Photoinitiator | 0.80 g |
| 2-Mercaptobenzothiazole (MBT) | 0.55 g |
| 2,6-Diisopropyldimethylaniline (DIDMA) | 0.82 g |
| CP 269 | 16.0 g |
| (Yellow dye precursor from Hilton Davis) | |
| Desmodur N-100 | 13.09 g |
| (Bayer Biuret, Polyisocyanate Resins) | |
| Magenta Capsule Internal Phase (550 nm) | |
| TMPTA | 147.3 g |
| DPHPA | 16.3 g |
| Photoinitiator | 0.47 g |
| 2-Mercaptobenzothiazole (MBT) | 0.55 g |
| 2,6-Diisopropyldimethylaniline | 1.09 g |
| CP164 | 25.3 g |
| (Magenta color precursor from | |
| Hilton-Davis Chemical Co.) | |
| Desmodur N-100 | 13.09 g |
| (Bayer Biuret Polyisocyanate Resins) | |
| Cyan Capsule Internal Phase (650 nm) | |
| TMPTA | 114.50 g |
| DPHPA | 49.10 g |
| Photoinitiator | 0.85 g |
| 2-Mercaptobenzothiazole (MBT) | 0.55 g |
| 2,6-Diisopropyldimethylaniline | 1.09 g |
| CP 270 | 16.0 g |
| (Cyan precursor from Yamada Chemical Co. Jpn) | |
| Desmodur N-100 | 13.09 g |
| (Bayer Biuret, Polyisocyanate Resins) | |

Microcapsules prepared as above can be mixed at different percentage ratios to prepare Cycolor Coating Composition. The ratios can be varied to obtain desired photographic characteristics.

A typical coating composition can be coated on PET support (Melinex) at different dry coat weights.

A typical Cylith composition is:

| Cyan Capsules | 38% |
|---|---|
| Megenta Capsules | 32% |
| Yellow Capsules | 30% |

Different aqueous coating compositions were formulated and coated at 17 g/m² dry coat weight. These had varying peel strength improvements over the standard coating composition.

EXAMPLE 1

Standard

| Cyliths | 29% |
|---|---|
| Phenolic Resin (from Schenectady Chemical Co.) | 68% |
| Polyvinyl alcohol | 1.5% |
| (airvol grade 205 from Air Products Co.) | |
| Sequrez 755 (Cross-linker) | 1.5% |

EXAMPLE 2

| Cyliths | 29% |
|---|---|
| Phenolic Resin (from Schenectady Chemical Co.) | 67% |
| Polyvinyl alcohol | 1.5% |
| (airvol grade 205 from Air Products Co.) | |
| Sequrez 755 (Binder) | 1.5% |
| Tinopal | 0.77% |
| (Triazole-phenyl coumarins (structure II)) | |

EXAMPLE 3

| Cyliths | 29% |
|---|---|
| Phenolic Resin (from Schenectady Chemical Co.) | 67% |
| Polyvinyl alcohol | 1.5% |
| (airvol grade 205 from Air Products Co.) | |
| Sequrez 755 (Binder) | 1.5% |
| Uvitex | 0.77% |
| (Bis-benzoxazoles (structure I), | |
| bis-stryryl biphenyls (structure III)) | |

EXAMPLE 4

| Cyliths | 29% |
|---|---|
| Phenolic Resin (from Schenectady Chemical Co.) | 41% |
| Polyvinyl alcohol | 1.5% |
| (airvol grade 205 from Air Products Co.) | |
| Sequrez 755 (Binder) | 1.5% |
| Tamol 850 | 1.0% |
| Filler ($CaCO_3$) | 26% |

EXAMPLE 5

| Cyliths | 29% |
|---|---|
| Phenolic Resin (from Schenectady Chemical Co.) | 40% |
| Polyvinyl alcohol | 1.5% |
| (airvol grade 205 from Air Products Co.) | |
| Sequrez 755 (Binder) | 1.5% |
| Tinopal | 1.5% |
| (Triazole-phenyl coumarins (structure II)) | |
| Tamol 850 | 1.0% |
| Filler ($CaCO_3$) | 25% |

EXAMPLE 6

| Cyliths | 29% |
|---|---|
| Phenolic Resin (from Schenectady Chemical Co.) | 40% |
| Polyvinyl alcohol | 1.5% |
| (airvol grade 205 from Air Products Co.) | |
| Sequrez 755 (Binder) | 1.5% |

-continued

| | |
|---|---|
| Uvitex | 1.5% |
| (Bis-benzoxazoles (structure I), | |
| bis-stryryl biphenyls (structure III)) | |
| Tamol 850 | 1.0% |
| Filler (CaCO$_3$) | 25% |

EXAMPLE 7

| | |
|---|---|
| Cyliths | 29% |
| Phenolic Resin (from Schenectady Chemical Co.) | 40% |
| Polyvinyl alcohol | 1.5% |
| (airvol grade 205 from Air Products Co.) | |
| Sequrez 755 (Binder) | 1.5% |
| Tinopal | 1.5% |
| (Triazole-phenyl coumarins (structure II)) | |
| Tamol 850 | 1.0% |
| Filler (Optiwhite) | 25% |

EXAMPLE 8

| | |
|---|---|
| Cyliths | 29% |
| Phenolic Resin (from Schenectady Chemical Co.) | 40% |
| Polyvinyl alcohol | 1.5% |
| (airvol grade 205 from Air Products Co.) | |
| Sequrez 755 (Binder) | 1.5% |
| Tinopal | 1.5% |
| (Triazole-phenyl coumarins (structure II)) | |
| Tamol 850 | 1.0% |
| Filler (Diafill) | 25% |

For purposes of the present invention, peel strength is determined in accordance with the following protocol:

1. The peel strength test device (Instron) is set-up and calibrated.
2. Imaging assembly samples are bleached out for at least 12 hours.
3. A 3 inch wide/2 sided tape (e.g. 3M-404) is unrolled with adhesive side up.
4. Samples are placed coated side down (backing side up) onto the unrolled tape.
5. Excess tape is removed at the end of the sample and the sample is cut down to a width of 3 inches.
6. The sample (imaging assembly and 2 sided tape) is run through the laminator with no heat applied.
7. The backing of the 2 sided tape is removed.
8. A 2 Kg roll is used to firmly apply the sample to the drum and remove all discontinuities and entrapped air.
9. The leading edge of the sample is aligned with the leading edge of a 2 sided tape leader and firmly applied using the 2 Kg roll.
10. The free end of the leader is bent at a 90 degree angle. The bend should be right at the edge of the sample to avoid damaging the sample.
11. The free end of the leader is clamped in the jaws of the peel testing device and the crosshead is moved away from the drum at a constant rate of 200 mm/min.
12. Static and dynamic peel data values are measured and recorded.

The Table below gives the Dynamic Peel value in gram force (gf) using an Instron Machine for samples prepared using the coating compositions set forth in the above examples. Significant improvements in peel strength as compared to the standard formulation (Example 1) are realized by incorporating adhesion promoters in the imaging assemblies of the present invention.

TABLE 1

| Sample ID | Dynamic Peel (g.f) |
|---|---|
| Example 1 (Standard) | 100 |
| Example 2 | 825 |
| Example 3 | 200 |
| Example 4 | 400 |
| Example 5 | 1450 |
| Example 6 | 825 |
| Example 7 | 350 |
| Example 8 | 550 |

Having described the invention in detail and by reference to preferred embodiments thereof, it will be apparent that modifications and variations are possible without departing from the scope of the invention as defined in the following claims.

What is claimed is:

1. A self-contained photohardenable imaging assembly comprising: a first transparent polymeric film support, an imaging layer comprising a plurality of photosensitive microcapsules, a developer material and an adhesion promoter, and a second support which may be transparent or opaque, wherein said adhesion promoter is selected from the group consisting of bis-benzoxazoles, phenylcoumarins, bis-(styryl)biphenyls and triazinyl derivatives of diaminostilbenedisulphonic acids and mixtures thereof.

2. The imaging assembly of claim 1 wherein said imaging assembly has a dynamic peel strength of at least 200 gf.

3. The imaging assembly of claim 1, wherein said phenylcoumarin is a phenylcoumarin selected from the group consisting of triazine-phenylcoumarins, benzotriazole-phenylcoumarins, naphtotriazole-phenylcoumarins and mixtures thereof.

4. The imaging assembly of claim 1 wherein said imaging layer further comprises a dispersant selected from the group consisting of polyvinyl alcohol, polyacrylic acid and salts thereof, polyacrylate and metal salts of condensed arylsulphonic acid and combinations thereof.

5. The imaging assembly of claim 1 wherein said microcapsules include: a first set of microcapsules containing a cyan color precursor, a second set of microcapsules containing a magenta color precursor, and a third set of microcapsules containing a yellow color precursor, each of said microcapsules further containing a photohardenable composition such that full color images can be obtained.

6. The imaging assembly of claim 5, wherein said first set of microcapsules is sensitive to red light, said second set of microcapsules is sensitive to blue light, and said third set of microcapsules is sensitive to green light.

7. The imaging assembly of claim 1 wherein said assembly is sealed such that the user of the assembly cannot come into contact with the contents of the assembly without destroying the assembly.

8. The imaging assembly of claim 1 wherein said first transparent support includes an inside surface and a subbing layer is provided on the inside surface of said first support, and said imaging layer of microcapsules and developer is provided on said subbing layer, and said second support includes an inside surface and an adhesive layer is provided on the inside surface of said second support wherein said imaging layer is bonded to said second support by said layer of adhesive.

9. The imaging assembly of claim 5, wherein said first, second and third sets of microcapsules are sensitive to visible, ultraviolet, or infrared radiation.

10. The imaging assembly of claim 1 wherein said second support is a plastic film containing a white pigment.

11. The imaging assembly of claim 1 wherein said imaging layer further comprises a filler material.

12. The imaging assembly of claim 11 wherein said filler material is selected from the group consisting of calcium carbonate, clays, talc, micas and mixtures thereof.

13. The imaging assembly of claim 11 wherein said imaging layer further comprises a dispersant.

14. The imaging assembly of claim 13 wherein said adhesion promotor is a triazole-phenyl coumarin, said filler is calcium carbonate and said dispersant is a polyacrylate.

15. The imaging assembly of claim 1 wherein said imaging assembly has a dynamic peel strength of at least two times that of a standard imaging assembly without an adhesion promotor.

16. A self-contained photohardenable imaging assembly comprising: first and second transparent polymeric film supports, an opaque support, and an imaging layer disposed between said first and second transparent supports on each side of said opaque support, each of said imaging layers including a plurality of photosensitive microcapsules containing a chromogenic material and a developer material, at least one of said imaging layers including an adhesion promoter selected from the group consisting of bis-benzoxazoles, phenylcoumarins, bis-(styryl)biphenyls, triazinyl derivatives of diaminostilbenedisulphonic acids and mixtures thereof; wherein by image-wise exposing each of said imaging units to actinic radiation and subjecting the imaging assembly to pressure, images can be formed in the imaging layers on each side of said opaque support.

17. The imaging assembly of claim 16 wherein said assembly is sealed such that the user of the assembly cannot come into contact with the contents of the assembly without destroying the assembly.

18. The imaging assembly of claim 16 wherein at least one of said imaging layers further comprises a filler material and a dispersant.

* * * * *